United States Patent
Sengupta et al.

(10) Patent No.: US 10,868,193 B2
(45) Date of Patent: Dec. 15, 2020

(54) NANOSHEET FIELD EFFECT TRANSISTOR CELL ARCHITECTURE

(71) Applicant: Samsung Electronics Co., Ltd., Suwon-si (KR)

(72) Inventors: Rwik Sengupta, Austin, TX (US); Mark Stephen Rodder, Dallas, TX (US); Joon Goo Hong, Austin, TX (US); Titash Rakshit, Austin, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/390,859

(22) Filed: Apr. 22, 2019

(65) Prior Publication Data

US 2020/0152801 A1 May 14, 2020

Related U.S. Application Data

(60) Provisional application No. 62/758,243, filed on Nov. 9, 2018.

(51) Int. Cl.
*H01L 29/786* (2006.01)
*H01L 29/66* (2006.01)
(Continued)

(52) U.S. Cl.
CPC .. *H01L 29/78696* (2013.01); *H01L 21/02532* (2013.01); *H01L 21/02603* (2013.01);
(Continued)

(58) Field of Classification Search
CPC ......... H01L 29/78696; H01L 21/02532; H01L 29/66545; H01L 27/092; H01L 29/42392;
(Continued)

(56) References Cited

U.S. PATENT DOCUMENTS 8,216,902 B2  7/2012  Chang et al.
9,490,323 B2  11/2016  Rodder et al.
(Continued)

OTHER PUBLICATIONS

Doyoung Jang, et al. "Device Exploration of NanoSheet Transistors for Sub-7-nm Technology Node", IEEE Transaction on Electron Devices, vol. 64, No. 6, Jun. 2017, pp. 2707-2713.

*Primary Examiner* — Karen Kusumakar
*Assistant Examiner* — Adam S Bowen
(74) *Attorney, Agent, or Firm* — Lewis Roca Rothgerber Christie LLP

(57) ABSTRACT

A semiconductor device includes first and second GAA FETs spaced apart by an inter-channel spacing. Each of the GAA FETs includes a horizontal nanosheet conductive channel structure, a gate material completely surrounding the horizontal nanosheet conductive channel structure, source and drain regions at opposite ends of the horizontal nanosheet conductive channel structure, source and drain contacts on the source and drain regions. A width of the horizontal nanosheet conductive channel structure of the first GAA FET or the second GAA FET is smaller than a maximum allowed width. The semiconductor device also includes a gate contact on the gate material in the inter-channel spacing between the first and second GAA FETs. The gate contact is spaced apart by a distance from each of the source and drain regions of the first and second GAA FETs in a range from a minimum design rule spacing to a maximum distance.

20 Claims, 5 Drawing Sheets

(51) Int. Cl.
*H01L 29/06* (2006.01)
*H01L 29/417* (2006.01)
*H01L 29/423* (2006.01)
*H01L 21/02* (2006.01)
*H01L 21/306* (2006.01)
*H01L 21/308* (2006.01)
*H01L 21/8238* (2006.01)
*H01L 27/092* (2006.01)

(52) U.S. Cl.
CPC ...... *H01L 21/308* (2013.01); *H01L 21/30604* (2013.01); *H01L 21/823807* (2013.01); *H01L 21/823814* (2013.01); *H01L 21/823828* (2013.01); *H01L 21/823871* (2013.01); *H01L 27/092* (2013.01); *H01L 29/0673* (2013.01); *H01L 29/41733* (2013.01); *H01L 29/42392* (2013.01); *H01L 29/66545* (2013.01); *H01L 29/66742* (2013.01); *H01L 29/78618* (2013.01)

(58) Field of Classification Search
CPC ..... H01L 21/823814; H01L 21/823807; H01L 29/0673; H01L 21/308; H01L 21/30604; H01L 21/823828; H01L 29/78618; H01L 29/66742; H01L 29/41733; H01L 21/02603; H01L 21/823871
USPC .......................................................... 257/351
See application file for complete search history.

(56) References Cited

U.S. PATENT DOCUMENTS

| | | | |
|---|---|---|---|
| 9,685,564 B2 | 6/2017 | Sengupta et al. | |
| 9,691,851 B1 | 6/2017 | Fung | |
| 9,859,369 B2 | 1/2018 | Cheng et al. | |
| 2006/0240622 A1* | 10/2006 | Lee | H01L 29/78645 438/257 |
| 2015/0228480 A1* | 8/2015 | Yin | H01L 29/42392 438/283 |
| 2016/0027870 A1* | 1/2016 | Cheng | H01L 29/66545 257/347 |
| 2017/0110595 A1* | 4/2017 | Sengupta | H01L 29/66545 |
| 2017/0200738 A1* | 7/2017 | Kim | H01L 21/845 |
| 2017/0256544 A1* | 9/2017 | Chai | H01L 21/30604 |
| 2018/0174642 A1 | 6/2018 | Huynh Bao et al. | |
| 2018/0342525 A1 | 11/2018 | Guillorn et al. | |

* cited by examiner

NANOSHEET FIELD EFFECT TRANSISTOR CELL ARCHITECTURE

CROSS-REFERENCE TO RELATED APPLICATION(S)

This application claims priority to and the benefit of U.S. Provisional Application No. 62/758,243, filed Nov. 9, 2018, the entire content of which is incorporated herein by reference.

FIELD

The present disclosure relates generally to gate-all-around field effect transistors and methods of manufacturing the same.

BACKGROUND

Semiconductor circuits are commonly formed from non-planar "fin" field effect transistors (finFETs). Conventional finFETs generally include multiple vertical fins serving as conducting channel regions. The power required to operate the semiconductor circuits may be reduced by changing the number of fins of the finFETs. However, as semiconductor circuits are scaled to smaller dimensions, several limitations may prevent the finFETs from being formed properly, including the lateral spacing between adjacent fins and the height of the fins required to achieve the desired effective width of the fins.

SUMMARY

The present disclosure is directed to various embodiments of a semiconductor device. In one embodiment, the semiconductor device includes a first gate-all-around (GAA) field effect transistor (FET) and a second GAA FET spaced apart from the first GAA FET by an inter-channel spacing. Each of the first GAA FET and the second GAA FET include at least one horizontal nanosheet conductive channel structure, a gate material completely surrounding each of the at least one horizontal nanosheet conductive channel structure, a source region at a first end of the at least one horizontal nanosheet conductive channel structure, a source contact on the source region, a drain region at a second end of the at least one horizontal nanosheet conductive channel structures opposite the first end, and a drain contact on the drain region. The semiconductor device also includes at least one gate contact on the gate material in the inter-channel spacing between the first and second GAA FETs. A width of the horizontal nanosheet conductive channel structure of the first GAA FET or the second GAA FET is smaller than a maximum allowed width. The semiconductor device also includes a gate contact on the gate material in the inter-channel spacing between the first and second GAA FETs. The gate contact is spaced apart by a distance from each of the source and drain regions of the first and second GAA FETs in a range from a minimum design rule spacing to a maximum distance.

The gate contact may be spaced apart by a distance greater than the minimum design rule spacing from one of the source region or the drain region of the first GAA FET or the second GAA FET.

The distance may be the maximum distance from the source region or the drain region of the first GAA FET or the second GAA FET.

The gate contact may be spaced apart by the maximum distance from the source region and the drain region of each of the first and second GAA FETs.

The first GAA FET may be a p-type FET and the second GAA FET may be an n-type FET. The width of the at least one horizontal nanosheet conductive channel structure of the first GAA FET may be greater than the width of the at least one horizontal nanosheet conductive channel structure of the second GAA FET.

The first GAA FET may be a p-type FET and the second GAA FET may be an n-type FET. The width of the at least one horizontal nanosheet conductive channel structure of the first GAA FET may be less than the width of the at least one horizontal nanosheet conductive channel structure of the second GAA FET.

The at least one horizontal nanosheet conductive channel structure may include a plurality of horizontal nanosheet conductive channel structures.

The width of the at least one horizontal nanosheet conductive channel structure may be in a range from approximately 5 nm to approximately 50 nm.

A semiconductor device according to another embodiment of the present disclosure includes a first GAA FET, a second GAA FET spaced apart from the first GAA FET by an inter-channel spacing, and a first gate contact and a second gate contact on the gate material in the inter-channel spacing between the first and second GAA FETs. The first and second gate contacts are staggered. Each of the first GAA FET and the second GAA FET includes at least one horizontal nanosheet conductive channel structure, a gate material completely surrounding each of the at least one horizontal nanosheet conductive channel structure, a source region at a first end of the at least one horizontal nanosheet conductive channel structure, a source contact on the source region, a drain region at a second end of the at least one horizontal nanosheet conductive channel structures opposite the first end, and a drain contact on the drain region.

A width of the at least one horizontal nanosheet conductive channel structure of the first GAA FET may be different than a width of the at least one horizontal nanosheet conductive channel structure of the second GAA FET.

A width of the at least one horizontal nanosheet conductive channel structure of the first GAA FET may be substantially the same as a width of the at least one horizontal nanosheet conductive channel structure of the second GAA FET.

A width of the at least one horizontal nanosheet conductive channel structure of each of the first and second GAA FETs may be in a range from approximately 5 nm to approximately 50 nm.

The present disclosure is also directed to various embodiments of a semiconductor chip. In one embodiment, the semiconductor chip includes first and second semiconductor devices each including a first GAA FET, a second GAA FET spaced apart from the first GAA FET by an inter-channel spacing, and at least one gate contact in the inter-channel spacing. Each of the first and second GAA FETs includes at least one horizontal nanosheet conductive channel structure, a gate material completely surrounding each of the at least one horizontal nanosheet conductive channel structure, a source region at a first end of the at least one horizontal nanosheet conductive channel structure, a source contact on the source region, a drain region at a second end of the at least one horizontal nanosheet conductive channel structure opposite the first end, and a drain contact on the drain region. A configuration of the first semiconductor device is different than a configuration of the second semiconductor device.

The first GAA FET of each of the first and second semiconductor devices may be one type of FET (e.g., a p-type FET or an n-type FET), and the second GAA FET of each of the first and second semiconductor devices may be another type of FET (e.g., a n-type FET or a p-type FET).

An effective channel width of the first GAA FET of the first semiconductor device may be different than an effective channel width of the first GAA FET of the second semiconductor device.

A width of the at least one horizontal nanosheet conductive channel structure of the first GAA FET of the first semiconductor device may be different than a width of the at least one horizontal nanosheet conductive channel structure of the first GAA FET of the second semiconductor device.

The at least one horizontal nanosheet conductive channel structure of the first GAA FET of the first semiconductor device may include a first series of horizontal nanosheet conductive channel structures and the at least one horizontal nanosheet conductive channel structure of the first GAA FET of the second semiconductor device may include a second series of horizontal nanosheet conductive channel structures different than the first series of horizontal nanosheet conductive channel structures.

At least one gate contact of the first semiconductor device may include a first gate contact and a second gate contact that are staggered.

The at least one gate contact of the second semiconductor device may include a single gate contact, and the single gate contact may be spaced a maximum distance from each of the source and drain regions of the first and second GAA FETs of the second semiconductor device.

The at least one horizontal nanosheet conductive channel structure may include a series of horizontal nanosheet conductive channel structures in a range from two horizontal nanosheet conductive channel structures to four horizontal nanosheet conductive channel structures.

A width of the at least one horizontal nanosheet conductive channel structure may be in a range from approximately 5 nm to approximately 50 nm.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

Figure 1A:
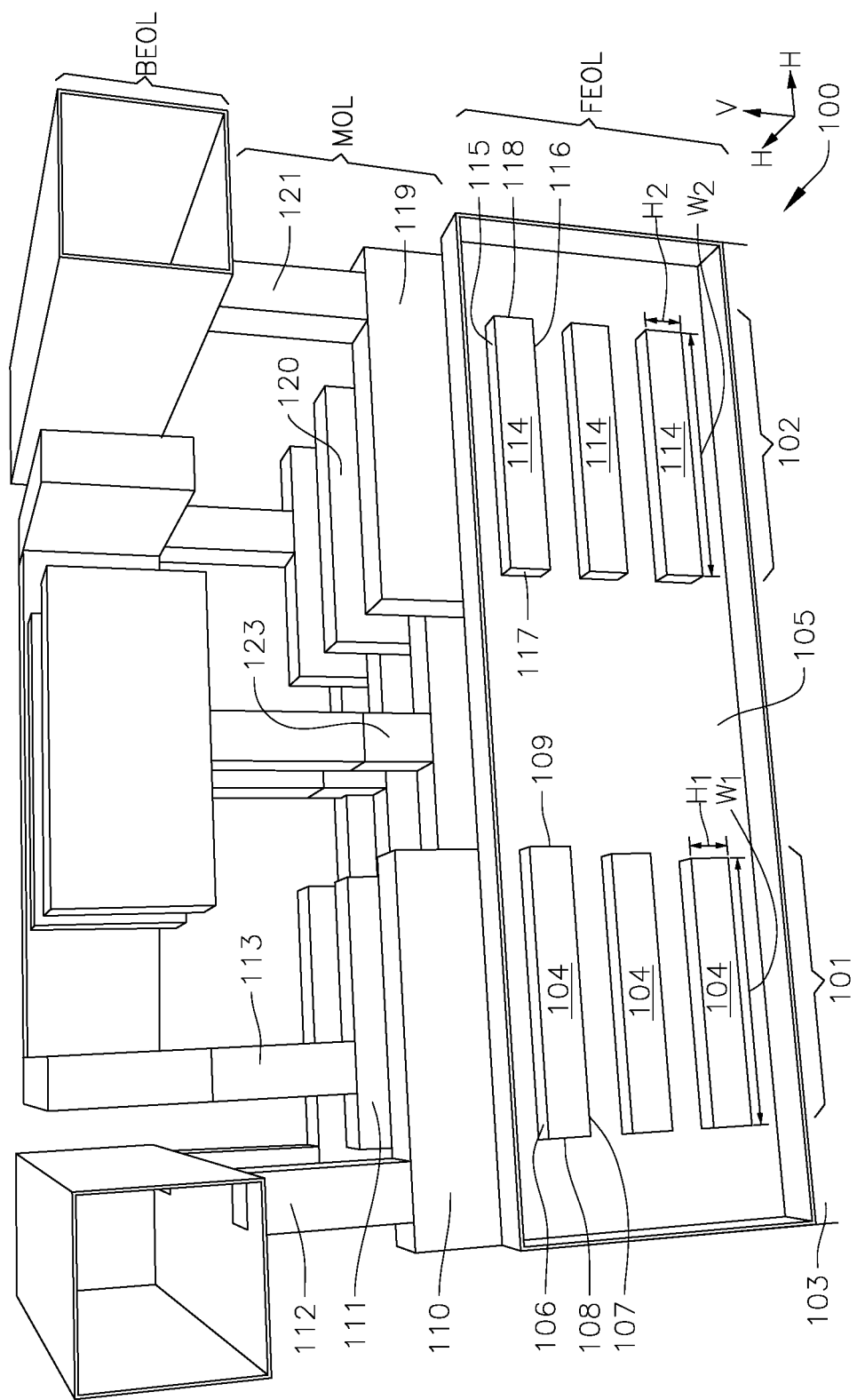
FIGS. 1A-1B are a perspective view and a side view, respectively, of a semiconductor device including gate-all-around (GAA) field-effect transistors (FETs) according to one embodiment of the present disclosure.

The present disclosure is directed to various embodiments of a semiconductor device including gate-all-around (GAA) field-effect transistors (FETs). The semiconductor devices according to one or more embodiments include a gate contact that is centered between the GAA FETs and spaced a maximum distance apart from source and drain regions and source and drain contacts of the GAA FETs, which reduces the operating power required for the semiconductor device without increasing cell height. The semiconductor devices according to various embodiments of the present disclosure may include a pair of staggered gate contacts between the GAA FETs, which enables dense cell layouts. Additionally, the semiconductor devices according to various embodiments of the present disclosure include GAA FETs having nanosheet channels with differing widths. The GAA FETs with the lower width nanosheet channels may be provided in non-timing critical paths of a semiconductor circuit to reduce power and may be utilized to improve circuit performance by selectively tuning feedback paths. The present disclosure is also directed to various embodiments of a semiconductor chip having a series of semiconductor devices in which the configurations of the semiconductor devices vary depending on region in which the semiconductor devices are provided such that the semiconductor chip may be configured for optimal circuit power, performance, area, and cost (PPAC).

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
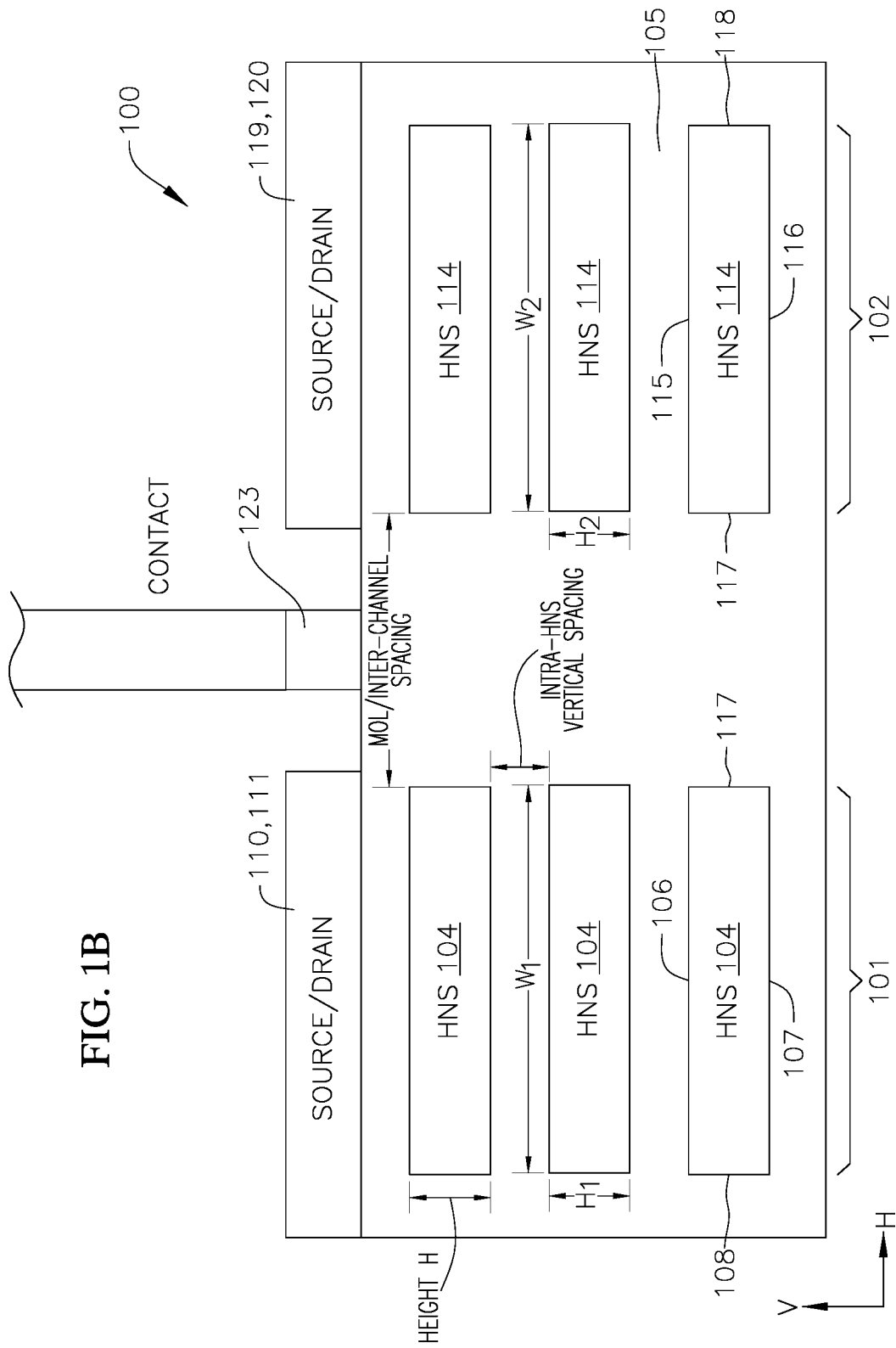

With reference now to FIGS. 1A-1B, a semiconductor device 100 according to one embodiment of the present disclosure includes a first gate-all-around (GAA) field effect transistor (FET) 101 and a second GAA FET 102 horizontally spaced apart from the first GAA FET 101 by an inter-channel spacing. The first and the second GAA FET are on a substrate 103. In one or more embodiments, the substrate 103 may be a bulk Si substrate, a strain relaxed buffer (SRB), or a silicon on insulator (SOI) substrate. Although in the illustrated embodiment the semiconductor device 100 includes two GAA FETs 101, 102, in one or more embodiments, the semiconductor device 100 may include any other suitable number of GAA FETs (e.g., the semiconductor device 100 may include more than two GAA FETs). In one or more embodiments, the first GAA FET 101 may be a p-type FET and the second GAA FET 102 may be an n-type FET. In one or more embodiments, the first GAA FET 101 may be n-type FET and the second GAA FET 102 may be a p-type FET. In one or more embodiments, the semiconductor device 100 may be a CMOS device.

In the illustrated embodiment, the first GAA FET 101 includes a stack of horizontal nanosheet conductive channel structures 104. Although in the illustrated embodiment the first GAA FET 101 includes three horizontal nanosheet conductive channel structures 104, in one or more embodiments, the first GAA FET 101 may include any other suitable number of horizontal nanosheet conductive channel structures 104, such as, for instance, in a range from two to four horizontal nanosheet conductive channel structures 104. The lowermost horizontal nanosheet conductive channel structure 104 is spaced apart from the substrate 103 by a vertical distance and adjacent horizontal nanosheet conductive channel structures 104 are spaced apart from each other by a vertical distance. In the illustrated embodiment, the first GAA FET 101 also includes a gate material 105 completely surrounding each of the horizontal nanosheet conductive channel structures 104 (e.g., the gate material 105 extends along an upper surface 106, a lower surface 107, and vertical sides 108, 109 of each of the horizontal nanosheet conductive channel structures 104). The first GAA FET 101 also includes a source region 110 at one side of the stack of horizontal nanosheet conductive channel structures 104, and a drain region 111 at an opposite side of the stack of horizontal nanosheet conductive channel structures 104. In the illustrated embodiment, the first GAA FET 101 also includes a source contact 112 on the source region 110 and a drain contact 113 on the drain region 111. Together, the horizontal nanosheet conductive channel structures 104 provide a channel region for the first GAA FET 101 that is responsive to a potential applied to the gate material 105 between the source and drain regions 110, 111. In one or more embodiments, the horizontal nanosheet conductive channel structures 104 may be silicon (Si), silicon-germanium (SiGe), and/or a group III-V semiconductor material, such as, for instance, indium gallium arsenide (InGaAs), indium arsenide (InAs), or indium antimonide (InSb).

In one or more embodiments, the gate material 105 completely surrounding each of the horizontal nanosheet conductive channel structures 104 may include a stack of materials completely surrounding each of the horizontal nanosheet conductive channel structures 104. For instance, in one or more embodiments, the gate material 105 may include a gate dielectric material and a work-function material. Additionally, in one or more embodiments, the gate material 105 may include a work-function tuning metal layer between a gate metal layer and a dielectric layer to control a work function of the gate material 105.

In the illustrated embodiment, each of the horizontal nanosheet conductive channel structures 104 of the first GAA FET 101 has a width $W_1$ in a range from approximately 5 nm to approximately 50 nm. In one or more embodiments, the width $W_1$ of the horizontal nanosheet conductive channel structures 104 may be in a range from approximately 10 nm to approximately 30 nm in the horizontal direction (H). Although in the illustrated embodiment each of the horizontal nanosheet conductive channel structures 104 of the first GAA FET 101 has the same width $W_1$ or substantially the same width $W_1$, in one or more embodiments, the horizontal nanosheet conductive channel structures 104 may have two or more different widths $W_1$. In one or more embodiments, the widths $W_1$ of the horizontal nanosheet conductive channel structures 104 may vary according to the vertical position at which the horizontal nanosheet conductive channel structure 104 is located. For example, in one or more embodiments, the width $W_1$ of the lowermost horizontal nanosheet conductive channel structure 104 may be wider than the width $W_1$ of the uppermost horizontal nanosheet conductive channel structure 104.

In one or more embodiments, each of the horizontal nanosheet conductive channel structures 104 of the first GAA FET 101 has a height $H_1$ in a range from approximately 2 nm to approximately 8 nm in the vertical direction (V). In one or more embodiments, the height $H_1$ of each of the horizontal nanosheet conductive channel structures 104 of the first GAA FET 101 may be in a range from approximately 3 nm to approximately 6 nm.

The effective channel width of the first GAA FET 101 is defined by the cumulative perimeters of the horizontal nanosheet conductive channel structures 104. In the illustrated embodiment, the perimeter of each of the horizontal nanosheet conductive channel structures 104 is defined by $2 \times W_1 + 2 \times H_1$. Accordingly, in the illustrated embodiment in which the first GAA FET 101 includes three horizontal nanosheet conductive channel structures 104, the effective channel width of the first GAA FET 101 is $3 \times (2 \times W_1 + 2 \times H_1)$.

In the illustrated embodiment, the second GAA FET 102 includes a stack of horizontal nanosheet conductive channel structures 114. Although in the illustrated embodiment the second GAA FET 102 includes three horizontal nanosheet conductive channel structures 114, in one or more embodiments, the second GAA FET 102 may include any other suitable number of horizontal nanosheet conductive channel structures 114, such as, for instance, in a range from two to four horizontal nanosheet conductive channel structures 114. Additionally, although in the illustrated embodiment the first and second GAA FETs 101, 102 include the same number of horizontal nanosheet conductive channel structures 104, 114, respectively, in one or more embodiments, the number of horizontal nanosheet conductive channel structures 114 in the second GAA FET 102 may be different than the number of horizontal nanosheet conductive channel structures 104 in the first GAA FET 101. The lowermost horizontal nanosheet conductive channel structure 114 is spaced apart from the substrate 103 by a vertical distance and adjacent horizontal nanosheet conductive channel structures 114 are spaced apart from each other by a vertical distance. In the illustrated embodiment, the gate material 105, which completely surrounds each of the horizontal nanosheet conductive channel structures 104 of the first GAA FET 101, also completely surrounding each of the horizontal nanosheet conductive channel structures 114 of the second GAA FET 102 (e.g., the gate material 105 extends along an upper surface 115, a lower surface 116, and vertical sides 117, 118 of each of the horizontal nanosheet conductive channel structures 114). The second GAA FET 102 also includes a source region 119 at one side of the stack of horizontal nanosheet conductive channel structures 114, and a drain region 120 at an opposite side of the stack of horizontal nanosheet conductive channel structures 114. In the illustrated embodiment, the second GAA FET 102 also includes a source contact 121 on the source region 119 and a drain contact (not shown) on the drain region 120. Together, the horizontal nanosheet conductive channel structures 114 provide a channel region for the second GAA FET 102 that is responsive to a potential applied to the gate material 105 between the source and drain regions 119, 120. In one or more embodiments, the horizontal nanosheet conductive channel structures 114 may be silicon (Si), silicon-germanium (SiGe), and/or a group III-V semiconductor material, such as, for instance, indium gallium arsenide (InGaAs), indium arsenide (InAs), or indium antimonide (InSb).

In one or more embodiments, each of the horizontal nanosheet conductive channel structures 114 of the second GAA FET 102 has a height $H_2$ in a range from approximately 2 nm to approximately 8 nm in the vertical direction (V). In one or more embodiments, the height $H_2$ of each of the horizontal nanosheet conductive channel structures 114 of the second GAA FET 102 may be in a range from approximately 3 nm to approximately 6 nm. Additionally, in the illustrated embodiment, the height $H_2$ of each of the horizontal nanosheet conductive channel structures 114 of the second GAA FET 102 is equal or substantially equal to the height $H_1$ of each of the horizontal nanosheet conductive channel structures 104 of the first GAA FET 101.

In the illustrated embodiment, each of the horizontal nanosheet conductive channel structures 114 of the second GAA FET 102 has a width $W_2$ in a range from approximately 5 nm to approximately 50 nm in the horizontal direction (H). In one or more embodiments, the width $W_2$ of the horizontal nanosheet conductive channel structures 114 may be in a range from approximately 10 nm to approximately 30 nm in the horizontal direction (H). Additionally, although in the illustrated embodiment each of the horizontal nanosheet conductive channel structures 114 of the second GAA FET 102 have the same width $W_2$ or substantially the same width $W_2$, in one or more embodiments, the horizontal nanosheet conductive channel structures 114 may have two or more different widths $W_2$. In one or more embodiments, the widths $W_2$ of the horizontal nanosheet conductive channel structures 114 may vary according to the vertical position at which the horizontal nanosheet conductive channel structure 114 is located. For example, in one or more embodiments, the width $W_2$ of the lowermost horizontal nanosheet conductive channel structure 114 may be wider than the width $W_2$ of the uppermost horizontal nanosheet conductive channel structure 114. Additionally, in one or more embodiments, the widths $W_2$ of the horizontal nanosheet conductive channel structures 114 of the second GAA FET 102 may be the same or substantially the same as the widths $W_1$ of the horizontal nanosheet conductive channel structures 104 of the first GAA FET 101. As described in more detail below with reference to FIGS. 2B-2C, in one or more embodiments, the width $W_2$ of the horizontal nanosheet conductive channel structures 114 of the second GAA FET 102 may be different than the width $W_1$ of the horizontal nanosheet conductive channel structures 104 of the first GAA FET 101. For instance, in one or more embodiments, the widths $W_2$ of the horizontal nanosheet conductive channel structures 114 of the second GAA FET 102 may be wider than the widths $W_1$ of the horizontal nanosheet conductive channel structures 104 of the first GAA FET 101, or the widths $W_1$ of the horizontal nanosheet conductive channel structures 104 of the first GAA FET 101 may be wider than the widths $W_2$ of the horizontal nanosheet conductive channel structures 114 of the second GAA FET 102.

The effective channel width of the second GAA FET 102 is defined by the cumulative perimeters of the horizontal nanosheet conductive channel structures 114. In the illustrated embodiment, the perimeter of each of the horizontal nanosheet conductive channel structures 114 is defined by $2 \times W_2 + 2 \times H_2$. Accordingly, in the illustrated embodiment in which the second GAA FET 102 includes three horizontal nanosheet conductive channel structures 114, the effective channel width of the second GAA FET 102 is $3 \times (2 \times W_2 + 2 \times H_2)$. In one or more embodiments, the effective channel width of the second GAA FET 102 may be the same as or substantially the same as the effective channel width of the first GAA FET 101. In one or more embodiments, the effective channel width of the second GAA FET 102 may be different than the effective channel width of the first GAA FET 101 by, for example, having different widths of the horizontal nanosheet conductive channel structures 104, 114 and/or a different number of horizontal nanosheet conductive channel structures 104, 114.

In the illustrated embodiment, the semiconductor device 100 also includes at least one gate contact 123 in contact with the gate material 105 (e.g., the semiconductor device 100 includes at least one gate contact 123 in contact on the gate material 105 that completely surrounds each of the horizontal nanosheet conductive channel structures 104, 114 in the first and second GAA FETs 101, 102). In the illustrated embodiment, the at least one gate contact 123 is located in the inter-channel spacing between the first and second GAA FETs 101, 102. The inter-channel spacing between the first and second GAA FETs 101, 102 is defined as the distance between corresponding edges 109, 117 of directly adjacent horizontal nanosheet conductive channel structures 104, 114 that are located in different GAA FETs 101, 102 but in a shared horizontal plane of the semiconductor device 100 (i.e., the inter-channel spacing between the first and second GAA FETs 101, 102 is defined as the distance between the edges 109 of the horizontal nanosheet conductive channel structures 104 of the first GAA FET 101 facing the horizontal nanosheet conductive channel structures 114 of the second GAA FET 102 and the corresponding edges 117 of the horizontal nanosheet conductive channel structures 114 of the second GAA FET 102 facing the horizontal nanosheet conductive channel structures 104 of the first GAA FET 101).

In one or more embodiments, the gate contact 123 may be located at a maximum distance from each of the source and drain regions 110, 111, 119, 120 (i.e., the gate contact 123 on the gate material 105 is spaced a maximum distance from each of the source region 110 of the first GAA FET 101, the drain region 111 of the first GAA FET 101, the source region 119 of the second GAA FET 102, and the drain region 120 of the second GAA FET 102). Locating the gate contact 123 at a maximum distance from each of the source and drain regions 110, 111, 119, 120 is configured to reduce the power of the semiconductor device 100 without increasing the cell height.

FIGS. 2A-2D depict different configurations of the first and second GAA FETs 101, 102 and the at least one gate contact 123 according to various embodiments of the present disclosure. In the embodiment illustrated in FIG. 2A, the first GAA FET 101 is a p-type FET and the second GAA FET 102 is an n-type FET. Additionally, in the illustrated embodiment, the widths $W_1$ of the horizontal nanosheet conductive channel structures 104 of the first GAA FET 101 are equal or substantially equal to the widths $W_2$ of the horizontal nanosheet conductive channel structures 114 of the second GAA FET 102. In the embodiment illustrated in FIG. 2A, the gate contact 123 is centered laterally between the first GAA FET 101 and the second GAA FET 102 (e.g., the gate contact 123 is centered between the first and second GAA FETs 101, 102 in a direction along which the inter-channel spacing between the first and second GAA FETs 101, 102 is defined). That is, the gate contact 123 is centered between the edges 109 of the horizontal nanosheet conductive channel structures 104 of the first GAA FET 101 facing the horizontal nanosheet conductive channel structures 114 of the second GAA FET 102 and the corresponding edges 117 of the horizontal nanosheet conductive channel structures 114 of the second GAA FET 102 facing the horizontal nanosheet conductive channel structures 104 of the first GAA FET 101. Additionally, in the illustrated embodiment, the gate contact 123 is centered longitudinally between the source and drain regions 110, 111, 119, 120 of the first and second GAA FETs 101, 102 (e.g., the gate contact 123 is centered between the source and drain regions 110, 111 of the first GAA FET 101 and between the source and drain regions 119, 120 of the second GAA FET 102 along a direction in which the channel length of each of the first and second GAA FETs 101, 102 is defined). Accordingly, in the embodiment illustrated in FIG. 2A, the gate contact 123 is located a maximum distance from each of the source and drain regions 110, 111, 119, 120 of the first and second GAA FETs 101, 102.

Figure 2A:
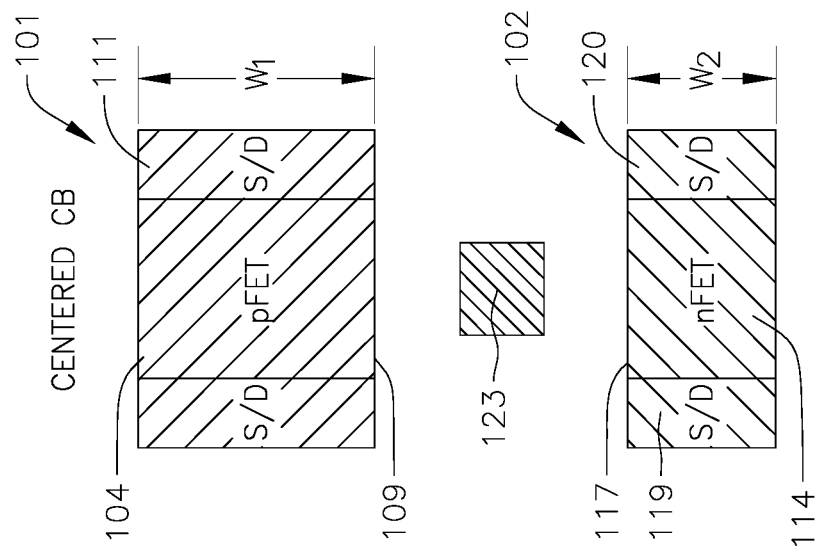
FIGS. 2A-2D are top view of a semiconductor device according to various embodiments of the present disclosure.
Figure 2B:
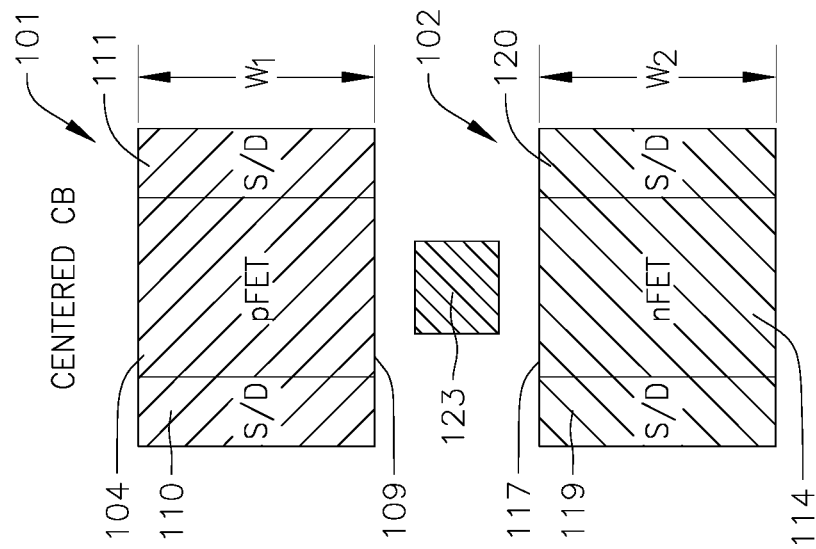

In the embodiment illustrated in FIG. 2B, the first GAA FET 101 is a p-type FET and the second GAA FET 102 is an n-type FET. Additionally, in the illustrated embodiment, the widths $W_1$ of the horizontal nanosheet conductive channel structures 104 of the first GAA FET 101 are greater than the widths $W_2$ of the horizontal nanosheet conductive channel structures 114 of the second GAA FET 102. In the embodiment illustrated in FIG. 2B, the gate contact 123 is centered laterally between the first GAA FET 101 and the second GAA FET 102 (e.g., the gate contact 123 is centered between the first and second GAA FETs 101, 102 in a direction along which the inter-channel spacing between the first and second GAA FETs 101, 102 is defined). That is, the gate contact 123 is centered between the edges 109 of the horizontal nanosheet conductive channel structures 104 of the first GAA FET 101 facing the horizontal nanosheet conductive channel structures 114 of the second GAA FET 102 and the corresponding edges 117 of the horizontal nanosheet conductive channel structures 114 of the second GAA FET 102 facing the horizontal nanosheet conductive channel structures 104 of the first GAA FET 101. Additionally, in the illustrated embodiment, the gate contact 123 is centered longitudinally between the source and drain regions 110, 111, 119, 120 of the first and second GAA FETs 101, 102 (e.g., the gate contact 123 is centered between the source and drain regions 110, 111 of the first GAA FET 101 and between the source and drain regions 119, 120 of the second GAA FET 102 along a direction in which the channel length of each of the first and second GAA FETs 101, 102 is defined). Accordingly, in the embodiment illustrated in FIG. 2B, the gate contact 123 is located a maximum distance from each of the source and drain regions 110, 111, 119, 120 of the first and second GAA FETs 101, 102.

In one or more embodiments, the gate contact 123 illustrated in FIG. 2B may not be located at a maximum distance from each of the source and drain regions 110, 111, 119, 120 of the first and second GAA FETs 101, 102. Instead, in one or more embodiments, the gate contact 123 may be located at a maximum distance from at least one of the source and drains regions 110, 111, 119, 120 of the first and second GAA FETs 101, 102 (e.g., the gate contact 123 may be located at a maximum distance from one or more of the source and drains regions 110, 111, 119, 120 of the first and second GAA FETs 101, 102, and located at least at a minimum design rule spacing from the remainder of the source and drains regions 110, 111, 119, 120 of the first and second GAA FETs 101, 102). In one or more embodiments, the gate contact 123 may be located at a distance greater than a minimum design rule spacing from at least one of the source and drains regions 110, 111, 119, 120 of the first and second GAA FETs 101, 102 (e.g., the gate contact 123 may be located at a distance greater than a minimum design rule spacing from one or more of the source and drains regions 110, 111, 119, 120 of the first and second GAA FETs 101, 102, and located at least at a minimum design rule spacing from the remainder of the source and drains regions 110, 111, 119, 120 of the first and second GAA FETs 101, 102).

Figure 2C:
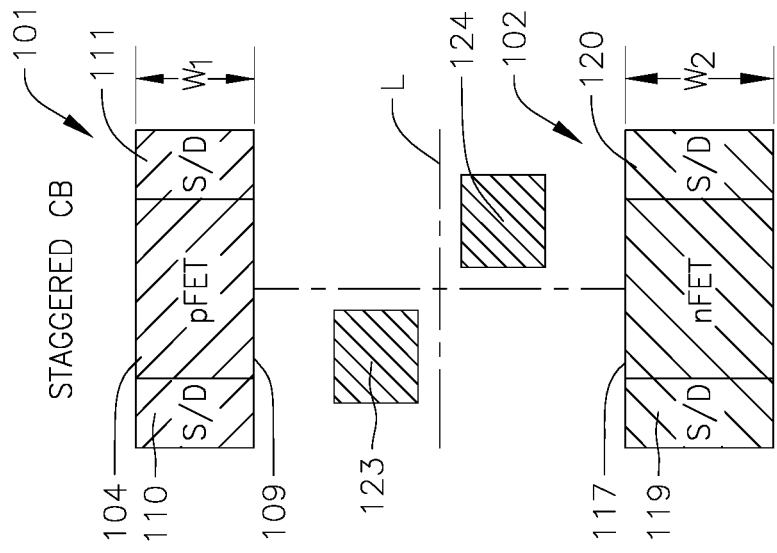

In the embodiment illustrated in FIG. 2C, the first GAA FET 101 is a p-type FET and the second GAA FET 102 is an n-type FET. Additionally, in the illustrated embodiment, the widths $W_2$ of the horizontal nanosheet conductive channel structures 114 of the second GAA FET 102 are greater than the widths $W_1$ of the horizontal nanosheet conductive channel structures 104 of the first GAA FET 101 (i.e., the widths $W_1$ of the horizontal nanosheet conductive channel structures 104 of the first GAA FET 101 are smaller than the widths $W_2$ of the horizontal nanosheet conductive channel structures 114 of the second GAA FET 102). In the embodiment illustrated in FIG. 2C, the gate contact 123 is centered laterally between the first GAA FET 101 and the second GAA FET 102 (e.g., the gate contact 123 is centered between the first and second GAA FETs 101, 102 in a direction along which the inter-channel spacing between the first and second GAA FETs 101, 102 is defined). That is, the gate contact 123 is centered between the edges 109 of the horizontal nanosheet conductive channel structures 104 of the first GAA FET 101 facing the horizontal nanosheet conductive channel structures 114 of the second GAA FET 102 and the corresponding edges 117 of the horizontal nanosheet conductive channel structures 114 of the second GAA FET 102 facing the horizontal nanosheet conductive channel structures 104 of the first GAA FET 101. Additionally, in the illustrated embodiment, the gate contact 123 is centered longitudinally between the source and drain regions 110, 111, 119, 120 of the first and second GAA FETs 101, 102 (e.g., the gate contact 123 is centered between the source and drain regions 110, 111 of the first GAA FET 101 and between the source and drain regions 119, 120 of the second GAA FET 102 along a direction in which the channel length of each of the first and second GAA FETs 101, 102 is defined). Accordingly, in the embodiment illustrated in FIG. 2C, the gate contact 123 is located a maximum distance from each of the source and drain regions 110, 111, 119, 120 of the first and second GAA FETs 101, 102.

In one or more embodiments, the gate contact 123 illustrated in FIG. 2C may not be located at a maximum distance from each of the source and drain regions 110, 111, 119, 120 of the first and second GAA FETs 101, 102. Instead, in one or more embodiments, the gate contact 123 may be located at a maximum distance from at least one of the source and drains regions 110, 111, 119, 120 of the first and second GAA FETs 101, 102 (e.g., the gate contact 123 may be located at a maximum distance from one or more of the source and drains regions 110, 111, 119, 120 of the first and second GAA FETs 101, 102, and located at least at a minimum design rule spacing from the remainder of the source and drains regions 110, 111, 119, 120 of the first and second GAA FETs 101, 102). In one or more embodiments, the gate contact 123 may be located at a distance greater than a minimum design rule spacing from at least one of the source and drains regions 110, 111, 119, 120 of the first and second GAA FETs 101, 102 (e.g., the gate contact 123 may be located at a distance greater than a minimum design rule spacing from one or more of the source and drains regions 110, 111, 119, 120 of the first and second GAA FETs 101, 102, and located at least at a minimum design rule spacing from the remainder of the source and drains regions 110, 111, 119, 120 of the first and second GAA FETs 101, 102).

Figure 2D:
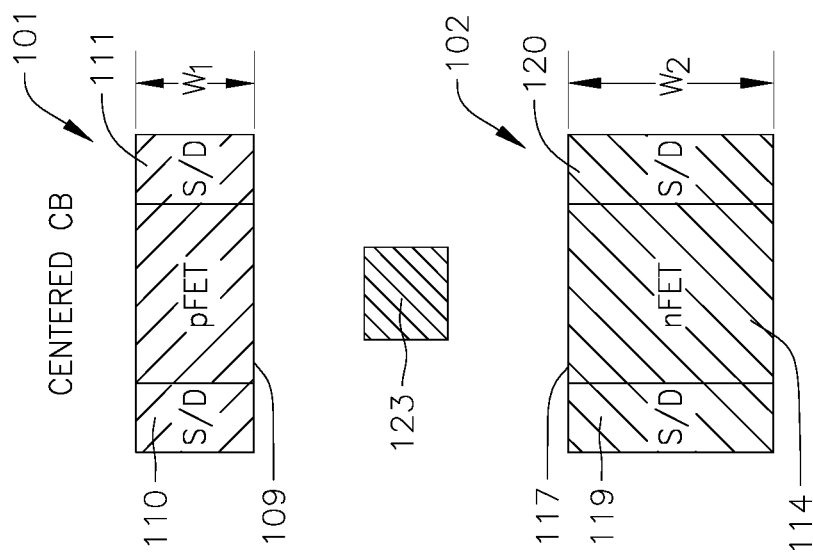

In the embodiment illustrated in FIG. 2D, the first GAA FET 101 is a p-type FET and the second GAA FET 102 is an n-type FET, and the semiconductor device 100 includes two gate contacts 123, 124 on the gate material 105 surrounding each of the horizontal nanosheet conductive channel structures 104, 114 of the first and second GAA FETs 101, 102. In the embodiment illustrated in FIG. 2D, the gate contacts 123, 124 are staggered in inter-channel spacing between the first and second GAA FETs 101, 102. In the embodiment illustrated in FIG. 2D, the width of the inter-channel spacing between the GAA FETs is increased by reducing the widths $W_1$, $W_2$ of the horizontal nanosheet conductive channel structures 104, 114 compared to the inter-channel spacing between the GAA FETs 101, 102 in the embodiment illustrated in FIG. 2A. In the illustrated embodiment, the first gate 123 contact is laterally offset, relative to a longitudinal centerline L of the inter-channel spacing, toward the first GAA FET 101 and the second gate contact 124 is laterally offset, relative to the centerline of the inter-channel spacing, toward the second GAA FET 102. That is, the first gate contact 123 is laterally spaced apart from the edges 109 of the horizontal nanosheet conductive channel structures 104 of the first GAA FET 101 by a first distance and laterally spaced apart from the edges 117 of the horizontal nanosheet conductive channel structure 114 of the second GAA FET 102 by a second distance greater than the first distance, and the second gate contact 124 is laterally spaced apart from the edges 117 of the horizontal nanosheet conductive channel structures 114 of the second GAA FET 102 by a first distance and laterally spaced apart from the edges 109 of the horizontal nanosheet conductive channel structures 104 of the first GAA FET 101 by a second distance greater than the first distance. Additionally, in the illustrated embodiment, the first gate contact 123 is longitudinally offset, relative to a transverse centerline perpendicular to the longitudinal centerline of the inter-channel spacing, toward the source regions 110, 119 of the first and second GAA FETs 101, 102 and the second gate contact 124 is longitudinally offset, relative to the transverse centerline, toward the drain regions 111, 120 of the first and second GAA FETs 101, 102. In one or more embodiments, the first gate contact 123 may be longitudinally offset toward the drain regions 111, 120 of the first and second GAA FETs 101, 102 and the second gate contact 124 may be longitudinally offset toward the source regions 110, 119 of the first and second GAA FETs 101, 102. That is, the first and second gate contacts 123, 124 are longitudinally offset in opposite directions along an axis about which the channel length of each of the first and second GAA FETs 101, 102 is defined. Accordingly, in the embodiment illustrated in FIG. 2D, the spacing is different between the first gate contact 123 and each of the source region 110 of the first GAA FET 101, the drain region 111 of the first GAA FET 101, the source region 119 of the second GAA FET 102, and the drain region 120 of the second GAA FET 102. Additionally, in the embodiment illustrated in FIG. 2D, the spacing is different between the second gate contact 124 and each of the source region 110 of the first GAA FET 101, the drain region 111 of the first GAA FET 101, the source region 119 of the second GAA FET 102, and the drain region 120 of the second GAA FET 102.

Furthermore, in the embodiment illustrated in FIG. 2D, the widths $W_1$ of the horizontal nanosheet conductive channel structures 104 of the first GAA FET 101 are equal or substantially equal to the widths $W_2$ of the horizontal nanosheet conductive channel structures 114 of the second GAA FET 102. In one or more embodiments, the widths $W_1$ of the horizontal nanosheet conductive channel structures 104 of the first GAA FET 101 may be different than the widths $W_2$ of the horizontal nanosheet conductive channel structures 114 of the second GAA FET 102 (i.e., the widths $W_1$ of the horizontal nanosheet conductive channel structures 104 of the first GAA FET 101 may be smaller or larger than the widths $W_2$ of the horizontal nanosheet conductive channel structures 114 of the second GAA FET 102).

The present disclosure is also directed to various embodiments of a system on chip (SoC) including a series of semiconductor devices each having a first GAA FET and a second GAA FET. In one or more embodiments, the SoC may include two or more of the semiconductor devices 100 illustrated in FIGS. 2A-2D. Accordingly, in one or more embodiments, the SoC may include semiconductor devices including GAA FETs having different channel widths in different regions or portions of the SoC. For instance, in one or more embodiments, the SoC may include a first semiconductor device including a pFET and an nFET each having the same or substantially the same channel widths and a gate contact centered between the pFET and the nFET (e.g., the configuration of the semiconductor device 100 illustrated in FIG. 2A), a second semiconductor device including a pFET having a larger channel width than an nFET and a gate contact centered between the pFET and the nFET (e.g., the configuration of the semiconductor device 100 illustrated in FIG. 2B), a third semiconductor device including a pFET having a smaller channel width than an nFET and a gate contact centered between the pFET and the nFET (e.g., the configuration of the semiconductor device 100 illustrated in FIG. 2C), a fourth semiconductor device including a pFET and an nFET each having the same channel widths and a pair of staggered gate contacts between the pFET and the nFET (e.g., the configuration of the semiconductor device 100 illustrated in FIG. 2D), or any desired combination thereof. Additionally, in one or more embodiments, the SoC may include semiconductor devices including GAA FETs with a different number of horizontal nanosheet conductive channel structures (e.g., the SoC may include a first semiconductor device including a p-type GAA FET and an n-type GAA FET each having two horizontal nanosheet conductive channel structures, and a second semiconductor device including a p-type GAA FET and an n-type GAA FET each having three horizontal nanosheet conductive channel structures). In one or more embodiments, both the number of horizontal nanosheet conductive channel structures and the widths of the horizontal nanosheet conductive channel structures may vary between the semiconductor devices of the SoC depending on the desired effective channel widths of the GAA FETs in the semiconductor devices. Accordingly, the effective widths of the channel regions of the nFETs and the pFETs may be different in different regions or portions of the SoC, and the semiconductor devices having a pFET and/or an nFET with a reduced effective channel width may be provided only in those portions or regions of the SoC that are in non-timing critical paths and operated with lower power (e.g., the effective channel widths of the GAA FETs of the semiconductor devices may vary according to the region or portion of the SoC in which the semiconductor device is located). In this manner, the SoC may be configured for optimal circuit power, performance, area, and cost (PPAC).

Figure 3:
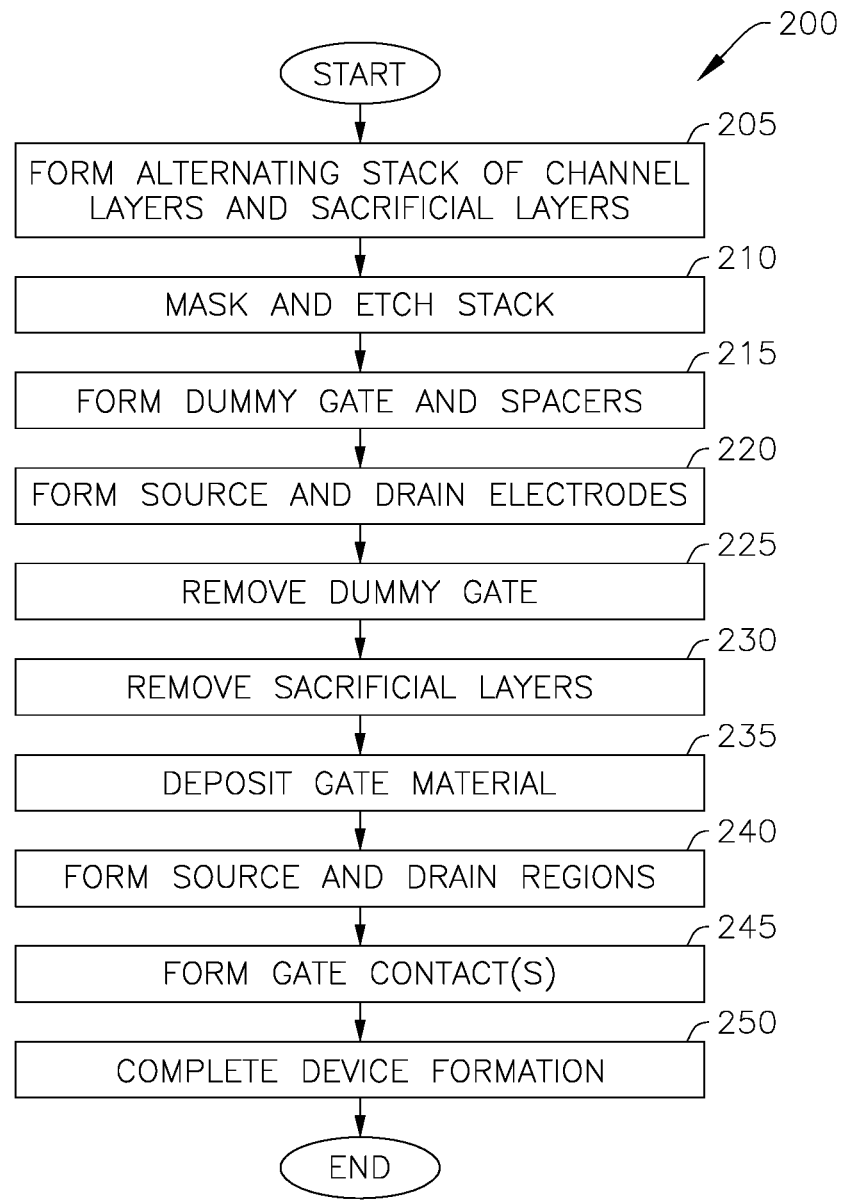
FIG. 3 is a flowchart depicting tasks of a method of forming a semiconductor device according to one embodiment of the present disclosure.

FIG. 3 illustrates tasks of a method 200 of forming a semiconductor device including a first gate-all-around (GAA) field effect transistor (FET) (e.g., a p-type GAA FET) and a second GAA FET (e.g., an n-type GAA FET) according to one embodiment of the present disclosure. In the illustrated embodiment, the method 200 includes a task 205 of forming or obtaining a stack of alternating conductive channel layers and sacrificial material layers on a substrate. In one or more embodiments, the substrate may be a bulk Si substrate, a strain relaxed buffer (SRB), or a silicon on insulator (SOI) substrate. In one or more embodiments, the conductive material of the conductive channel layers may be silicon (Si) and the sacrificial material of the sacrificial layers may be silicon-germanium (SiGe). In one or more embodiments, the conductive material of the conductive channel layers may be SiGe and the sacrificial material of the sacrificial layers may be Si. The sacrificial layers may have any suitable thickness depending on the desired vertical spacing between the horizontal nanosheet conductive channel structures of the first and second GAA FETs. In one or more embodiments, the number of channel layers in the stack may be from two to six channel layers (e.g., three channel layers), although in one or more embodiments the initial stack may include any other suitable number of channel layers depending on the desired sizes of the first and second GAA FETs.

In the illustrated embodiment, the method 200 also includes a task 210 of masking and etching the stack of alternating conductive channel layers and sacrificial layers to form a first stack of alternating conductive channel layers and sacrificial layers for the first GAA FET and a second stack of alternating conductive channel layers and sacrificial layers for the second GAA FET. Following the task 210 masking and etching the initial stack, the first stack for the first GAA FET and the second stack for the second GAA FET are spaced apart from each other by an inter-channel spacing. In one or more embodiments, the task of masking and etching the stack of alternating conductive channel layers and sacrificial layers may be performed by any suitable process or processes, including, for example, extreme ultraviolet (EUV) lithography, EUV litho-etch-litho-etch (LELE), or self-aligned patterning techniques (e.g., self-aligned double patterning (SADP)). In one or more embodiments, following the task 210 of masking and etching the initial stack, the conductive channel layers in the first stack for the first GAA FET have a different width than the conductive channel layers in the second stack for the second GAA FET. In one or more embodiments, the task may include performing LELE EUV or 193$i$ and utilizing one LE for the n-type GAA FET and another LE for the p-type GAA FET to achieve conductive channel layers that have different widths in the first stack for the first GAA FET (e.g., the n-type GAA FET) and the second stack for the second GAA FET (e.g., the p-type GAA FET). Additionally, in one or more embodiments, the task 210 may include a single mask step or multiple mask steps to define the widths of the conductive channel layers in the first and second stacks.

In the illustrated embodiment, the method 200 also includes a task 215 of forming a dummy gate stack (e.g., a dummy gate formed of oxide/poly-Si/nitride) and gate spacers on each of the first and second stacks formed in task 220.

The gate spacers may be formed by any process known in the art, such as nitride deposition, on opposite sides of the dummy gate stack. In one or more embodiments, the material of the gate spacers may be Silicon Oxide, Silicon Nitride, Silicon Carbon Oxide, Silicon Boron Carbon Nitride, Silicon Carbon Nitride, or combinations thereof.

In the illustrated embodiment, the method 200 also includes a task 220 of forming source and drain electrodes on opposite sides of each of the first and second stacks. The task of forming the source and drain electrodes may include the task of epitaxially re-growing the source and drain electrodes.

In the illustrated embodiment, the method 200 also includes a task 225 of depositing an interlayer dielectric (ILD) on the source and drain electrodes, performing chemical mechanical planarization (CMP) to a top of the dummy gate stack, and then removing the dummy gate stack.

In the illustrated embodiment, the method 200 also includes a task 230 of removing the sacrificial layers between the adjacent conductive channel layers in each of the first and second stacks. The task 230 of removing the sacrificial layers may be performed by a wet etch, a dry etch, or a combination of a wet etch and a dry etch that is selective with respect to the conductive channel layers. Following the task 230 of removing the sacrificial layers, the conductive channel layers will be supported by the gate spacers formed in task 215.

In the illustrated embodiment, the method 200 also includes a task 235 of depositing a gate material in the gate stack cavities formed by the task of removing the dummy gate stack and in the vertical separation regions between the conductive channel layers formed by the task of removing the sacrificial layers. Following the task 235 of depositing the gate material, the gate material completely surrounds each of the conductive channel layers in each of the first and second stacks. The task of depositing the gate material may be performed by an atomic layer deposition process. Additionally, in one or more embodiments, the task 235 of depositing the gate material may also include depositing components, such as a gate dielectric, a gate metal, a gate work-function metal, a work-function tuning metal, and/or a low-resistance capping metal and dielectric capping material.

In the illustrated embodiment, the method 200 also includes a task 240 of forming source and drain regions which may include the task of etching the ILD and depositing and etching metal to form source and drain regions on opposite sides of the gate material.

In the illustrated embodiment, the method 200 also includes a task 245 of forming at least one gate contact on the gate material, which was deposited in task 235, in the inter-channel spacing between the conductive channel layers in the first GAA FET and the conductive channel layers in the second GAA FET. In one or more embodiments, the task 245 of forming the at least one gate contact may include forming a single gate contact centered between the first and second GAA FETs such that the single gate contact is spaced a maximum distance away from the source and drain regions of the first and second GAA FETs (e.g., as illustrated in FIGS. 2A-2C) or forming two staggered gate contacts (e.g., as illustrated in FIG. 2D).

The method 200 also includes a task 250 of completing formation of the GAA FET and a circuit including one or more of the GAA FETs by tasks known in the art, including a task of source and drain contact formation, and a task of back-end-of-line (BEOL) formation. Additionally, in one or more embodiments, the method 200 may include forming partial gate-all-around (GAA) FETs, conventional full GAA FETs, and/or conventional finFETs on the same chip/circuit as the GAA FET formed according to the tasks of the present disclosure described above.

What is claimed is:

1. A semiconductor device comprising:
a first gate-all-around (GAA) field effect transistor (FET);
a second GAA FET spaced apart from the first GAA FET by an inter-channel spacing, each of the first GAA FET and the second GAA FET comprising:
at least one horizontal nanosheet conductive channel structure;
a gate material completely surrounding each of the at least one horizontal nanosheet conductive channel structure;
a source region at a first end of the at least one horizontal nanosheet conductive channel structure;
a source contact on the source region;
a drain region at a second end of the at least one horizontal nanosheet conductive channel structures opposite the first end; and
a drain contact on the drain region,
wherein a width of the at least one horizontal nanosheet conductive channel structure of at least one of the first GAA FET or the second GAA FET is smaller than a maximum allowed width; and
at least one gate contact on the gate material in the inter-channel spacing between the first and second GAA FETs, the at least one gate contact being spaced apart by a distance from each of the source and drain regions of the first and second GAA FETs in a range from a minimum design rule spacing to a maximum distance.

2. The semiconductor device of claim 1, wherein the at least one gate contact is spaced apart by a distance greater than the minimum design rule spacing from at least one of the source region or the drain region of at least one of the first GAA FET and the second GAA FET.

3. The semiconductor device of claim 2, wherein the distance is the maximum distance from the at least one of source region or the drain region of at least one of the first GAA FET and the second GAA FET.

4. The semiconductor device of claim 1, wherein the at least one gate contact is spaced apart by the maximum distance from each of the source region and the drain region of each of the first GAA FET and the second GAA FET.

5. The semiconductor device of claim 1, wherein the first GAA FET is a p-type FET and the second GAA FET is an n-type FET, and wherein the width of the at least one horizontal nanosheet conductive channel structure of the first GAA FET is greater than the width of the at least one horizontal nanosheet conductive channel structure of the second GAA FET.

6. The semiconductor device of claim 1, wherein the first GAA FET is a p-type FET and the second GAA FET is an n-type FET, and wherein the width of the at least one horizontal nanosheet conductive channel structure of the first GAA FET is less than the width of the at least one horizontal nanosheet conductive channel structure of the second GAA FET.

7. The semiconductor device of claim 1, wherein the at least one horizontal nanosheet conductive channel structure comprises a plurality of horizontal nanosheet conductive channel structures.

8. The semiconductor device of claim 1, wherein the width of the at least one horizontal nanosheet conductive channel structure is in a range from approximately 5 nm to approximately 50 nm.

9. A semiconductor device comprising:
a first gate-all-around (GAA) field effect transistor (FET);
a second GAA FET spaced apart from the first GAA FET by an inter-channel spacing, each of the first GAA FET and the second GAA FET comprising:
at least one horizontal nanosheet conductive channel structure;
a gate material completely surrounding each of the at least one horizontal nanosheet conductive channel structure;
a source region at a first end of the at least one horizontal nanosheet conductive channel structure;
a source contact on the source region;
a drain region at a second end of the at least one horizontal nanosheet conductive channel structures opposite the first end; and
a drain contact on the drain region; and
a first gate contact and a second gate contact on the gate material in the inter-channel spacing between the first and second GAA FETs, the first and second gate contacts being staggered.

10. The semiconductor device of claim 9, wherein a width of the at least one horizontal nanosheet conductive channel structure of the first GAA FET is different than a width of the at least one horizontal nanosheet conductive channel structure of the second GAA FET.

11. The semiconductor device of claim 9, wherein a width of the at least one horizontal nanosheet conductive channel structure of the first GAA FET is substantially the same as a width of the at least one horizontal nanosheet conductive channel structure of the second GAA FET.

12. The semiconductor device of claim 9, wherein a width of the at least one horizontal nanosheet conductive channel structure of each of the first and second GAA FETs is in a range from approximately 5 nm to approximately 50 nm.

13. A semiconductor chip comprising:
a first semiconductor device comprising a first gate-all-around (GAA) field effect transistor (FET), a second GAA FET spaced apart from the first GAA FET by an inter-channel spacing, and at least one gate contact in the inter-channel spacing;
a second semiconductor device comprising a first gate-all-around (GAA) field effect transistor (FET), a second GAA FET spaced apart from the first GAA FET by an inter-channel spacing, and at least one gate contact in the inter-channel spacing, wherein each of the first and second GAA FETs comprises:
at least one horizontal nanosheet conductive channel structure;
a gate material completely surrounding each of the at least one horizontal nanosheet conductive channel structure;
a source region at a first end of the at least one horizontal nanosheet conductive channel structure;
a source contact on the source region;
a drain region at a second end of the at least one horizontal nanosheet conductive channel structure opposite the first end; and
a drain contact on the drain region,
wherein a configuration of the first semiconductor device is different than a configuration of the second semiconductor device.

14. The semiconductor chip of claim 13, wherein the first GAA FET of each of the first and second semiconductor devices is one of a p-type FET or an n-type FET, and wherein the second GAA FET of each of the first and second semiconductor devices is the other of a p-type FET and an n-type FET.

15. The semiconductor chip of claim 13, wherein an effective channel width of the first GAA FET of the first semiconductor device is different than an effective channel width of the first GAA FET of the second semiconductor device.

16. The semiconductor chip of claim 15, wherein a width of the at least one horizontal nanosheet conductive channel structure of the first GAA FET of the first semiconductor device is different than a width of the at least one horizontal nanosheet conductive channel structure of the first GAA FET of the second semiconductor device.

17. The semiconductor chip of claim 15, wherein the at least one horizontal nanosheet conductive channel structure of the first GAA FET of the first semiconductor device comprises a first plurality of horizontal nanosheet conductive channel structures and the at least one horizontal nanosheet conductive channel structure of the first GAA FET of the second semiconductor device comprises a second plurality of horizontal nanosheet conductive channel structures different than the first plurality of horizontal nanosheet conductive channel structures.

18. The semiconductor chip of claim 13, wherein the at least one gate contact of the first semiconductor device comprises a first gate contact and a second gate contact, the first and second gate contacts being staggered.

19. The semiconductor chip of claim 18, wherein the at least one gate contact of the second semiconductor device comprises a single gate contact, the single gate contact being spaced a maximum distance from each of the source and drain regions of the first and second GAA FETs of the second semiconductor device.

20. The semiconductor chip of claim 13, wherein the at least one horizontal nanosheet conductive channel structure comprises a plurality of horizontal nanosheet conductive channel structures in a range from two horizontal nanosheet conductive channel structures to four horizontal nanosheet conductive channel structures.

* * * * *